(12) United States Patent
Schulz-Harder

(10) Patent No.: US 7,036,711 B2
(45) Date of Patent: May 2, 2006

(54) PROCESS FOR THE MANUFACTURE OF METAL-CERAMIC COMPOUND MATERIAL IN PARTICULAR METAL-CERAMIC SUBSTRATES AND METAL-CERAMIC COMPOUND MATERIAL ESPECIALLY METAL-CERAMIC SUBSTRATE MANUFACTURED ACCORDING TO THIS PROCESS

(76) Inventor: Jurgen Schulz-Harder, Hugo-Dietz-Strasse 32, D-91207 Lauf (DE)

( * ) Notice: Subject to any disclaimer, the term of this patent is extended or adjusted under 35 U.S.C. 154(b) by 0 days.

(21) Appl. No.: 10/416,540
(22) PCT Filed: Sep. 5, 2002
(86) PCT No.: PCT/DE02/03275
  § 371 (c)(1),
  (2), (4) Date: Sep. 11, 2003
(87) PCT Pub. No.: WO03/031372
  PCT Pub. Date: Apr. 17, 2003

(65) Prior Publication Data
  US 2004/0026482 A1 Feb. 12, 2004

(30) Foreign Application Priority Data
  Oct. 1, 2001 (DE) ........................... 101 48 550

(51) Int. Cl.
  *B23K 31/02* (2006.01)

(52) U.S. Cl. ..................... 228/219; 228/122.1

(58) Field of Classification Search .............. 228/122.1, 228/188, 219, 262.61
See application file for complete search history.

(56) References Cited

U.S. PATENT DOCUMENTS

| | | | |
|---|---|---|---|
| 3,766,634 A | | 10/1973 | Babcock et al. |
| 3,994,430 A | | 11/1976 | Cusano et al. |
| 4,278,195 A | * | 7/1981 | Singh ....................... 228/123.1 |
| 4,483,810 A | | 11/1984 | Bunk et al. |
| 4,505,418 A | | 3/1985 | Neidig et al. |
| 5,082,163 A | * | 1/1992 | Kanahara et al. ......... 228/124.1 |
| 5,108,026 A | * | 4/1992 | Su et al. ................... 228/122.1 |
| 5,340,655 A | * | 8/1994 | Creber et al. ............... 428/446 |
| 6,745,930 B1 | * | 6/2004 | Schmitt .................... 228/122.1 |

FOREIGN PATENT DOCUMENTS

| | | |
|---|---|---|
| DE | 30 36 128 A1 | 4/1982 |
| DE | 201 16 816 | 5/2002 |

* cited by examiner

Primary Examiner—Jonathan Johnson
(74) Attorney, Agent, or Firm—Hoffman, Wasson & Gitler

(57) ABSTRACT

In a process for the manufacture of metal-ceramic compound material, especially metal-ceramic substrates, bonding compounds in the form of a plate-shaped ceramic substrate and an oxidized metal foil are bonded together by means of heating to a processing temperature in a protective gas atmosphere. For this purpose, the bonding components are placed in a reaction space formed within a capsule, which (space) is separated from the outer protective gas atmosphere by the capsule or in connection with the outer protective gas atmosphere only by means of a small opening.

25 Claims, 3 Drawing Sheets

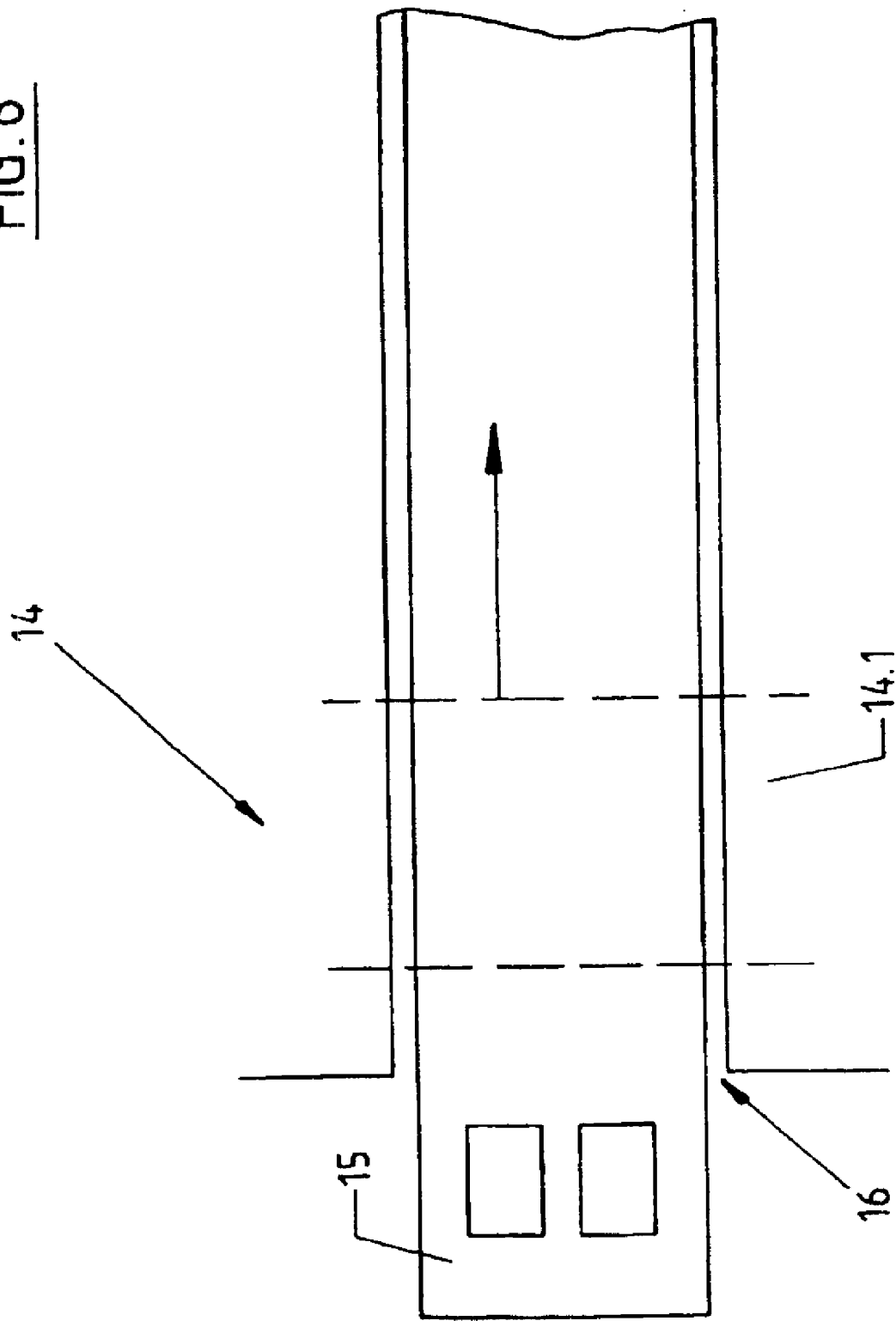

PROCESS FOR THE MANUFACTURE OF METAL-CERAMIC COMPOUND MATERIAL IN PARTICULAR METAL-CERAMIC SUBSTRATES AND METAL-CERAMIC COMPOUND MATERIAL ESPECIALLY METAL-CERAMIC SUBSTRATE MANUFACTURED ACCORDING TO THIS PROCESS

BACKGROUND OF THE INVENTION

The invention relates to a process and to a metal-ceramic compound material or metal-ceramic substrate.

The term "direct bonding" refers to processes for bonding a metal with ceramic, i.e. for the manufacture of metal-ceramic compound material, by means of a surface layer of the metal functioning as a eutectic and produced by a reactive gas, for example a metal oxide layer, which during heating of the metal and ceramic to be connected (hereinafter "bonding components") to a processing or bonding temperature (eutectic temperature) melts and produces the bond between the bonding components by interlacing the ceramic as a kind of solder during the subsequent cooling. The bonding temperature in this process is below the melting temperature of the metal. In particular also depending on the metal used, this bonding temperature is between approximately 714° C. (copper phosphorous) and 1820° C. (chromium oxygen).

In a known direct bonding process (DE 23 19 854/U.S. Pat. No. 3,766,634) the metal is first oxidized at a temperature below the bonding temperature in a protective gas atmosphere containing oxygen. Afterwards, the metal and the ceramic are heated to the bonding temperature. This is followed by cooling to room temperature. For the copper-oxygen system an oxygen content of 0.01–0.5 percent by volume (100 to 5000 ppm) is specified for the reactive atmosphere.

A more advanced direct bonding process (DE 26 338 69/U.S. Pat. No. 3,994,430) is also known in which the metal is treated or oxidized with the reactive gas in a separate step preceding bonding. After the metal and ceramic components to be bonded are placed together, they are heated to the bonding temperature in a furnace, in a protective gas atmosphere with an oxygen content of 0.01–0.05 percent by volume (100–5000 ppm).

Furthermore, a direct bonding process (DE 30 36 128) is known in which the bonding of copper and ceramic takes place in a vacuum furnace with an oxygen content between 0.001–0.1 mbar (approximately 1–100 ppm).

It has also been suggested (DE 32 04 167/U.S. Pat. No. 4,483,810) to execute the direct bonding process in a continuous or tunnel furnace in a protective gas atmosphere, whereby the oxygen content is set to 20–50 ppm through the dosed addition of oxygen to the protective gas, at a temperature between 960° C. and 1072° C.

In all of the above known processes the oxygen content of the protective gas atmosphere is far above an equilibrium oxygen content of the copper-oxygen system. From the literature it is known that the oxygen content of this system is on the order of 2.6–5 ppm in the temperature range in which the direct bonding or DCB process is executed.

For example, in "The Metallurgy of Copper", Incra Series, Vol II, pp. 56, 60, a value of 2.704 is stated for logK of the reaction $Cu+\frac{1}{2} O_2=Cu_2O$ at a temperature of 1085° C. This corresponds to a fractional oxygen content of $3.9 \times 10^{-6}$ Atm, which is approximately 3.9 ppm.

From "Electronic Equilibrium Examinations of the Copper-Oxygen System between 1065 and 1300° C.", post-doctoral thesis by J. Osterwald, Berlin 1965, the following formula is known for the temperature dependence of the fractional oxygen content:

$$\log(p_{O2})=-(20970/T)+10.166,$$

where $P_{O2}$ is the fractional oxygen content in ppm and T is the temperature in ° C.

From this formula the following fractional oxygen contents can be defined in dependency on the temperature:

| Temperature in ° C. | Fractional content in ppm |
|---|---|
| 1065 | 3.1 |
| 1075 | 4.2 |
| 1085 | 5.3 |

In a further publication (Neumann et al Metal Process, 1985, page 85) the oxygen content of the copper-oxygen system at a eutectic temperature of 1065° C. is specified as $2.69 \times 10^{-6}$, which is approximately 2.69 ppm.

Therefore, it can be assumed that the equilibrium oxygen content in the direct bonding of copper and ceramic (DCB process) is between 2 and 6 ppm.

One of the disadvantages of the known processes mentioned above is therefore that due to the considerably higher oxygen content in the protective ga atmosphere in which the DCB process is conducted, post-oxidation of the copper takes place.

The present invention is based on the knowledge that the regulation of the oxygen content in a protective gas atmosphere in the range below 10 ppm, especially in the factory production of metal-ceramic composites or substrates is not possible with the required precision, or at most at a very high cost due to the complex technology involved. Furthermore, the invention is based on the knowledge that a fractional oxygen pressure or oxygen content in the protective gas atmosphere of the DCB process smaller than the equilibrium pressure of the metal (copper)-oxygen system leads to a reduction of the adhesion of the metal (copper) to the ceramic, while excessive fractional oxygen pressure or oxygen content in the protective gas atmosphere causes heavy post-oxidation, which in extreme cases can result in the melting of the entire metal, for example of the entire metal or copper foil.

The object of the present invention is to present a process which avoids the disadvantages of the known processes and which enables a simplified method of manufacturing metal-ceramic composites, especially metal-ceramic substrates and especially such substrates for electric or electronic circuits of extremely high quality.

SUMMARY OF THE INVENTION

"Internal protective gas atmosphere" according to the invention refers to the protective gas atmosphere within the encapsulated interior or reaction space of a capsule. "Outer protective gas atmosphere" refers to the protective gas atmosphere that surrounds the respective capsule during the direct bonding process, i.e. the protective gas atmosphere in a furnace.

In the process according to the invention, which is especially suitable for the manufacture of metal-ceramic substrates and especially for the manufacture of copper-ceramic substrates for use as printed circuit boards for electric controls and circuits, at least one ceramic substrate and one metal foil are located in the encapsulated space or reaction space formed in the capsule such that the metal foil bears with an oxidized surface area against a surface area of the plate-shaped ceramic substrate. In order to produce the bond by means of direct bonding the ceramic substrate and the metal foil are heated in the reaction space formed by the interior of the capsule in a protective gas atmosphere there ("inner protective gas atmosphere") to a temperature that is below the melting temperature of the metal, but at least equal to the melting temperature of the eutectic metal oxide (i.e. $Cu_2O$). In a subsequent processing step, cooling of the capsule and of the components located in the reaction space takes place, likewise under protective gas.

The capsule used is for example not completely closed toward the outside, but rather has at least one opening, through which the exchange of gas can take place between the inner and the outer protective gas atmosphere. This exchange of gas serves, for example, to displace the air that is present in the encapsulated reaction space at the beginning of the process by the protective gas. However, the encapsulation achieved by means of the capsule is at least 60%. "Encapsulation" according to the invention refers to the percentage of the closed surface area of the total surface area surrounding the encapsulated interior (total surface less the surface of the openings) with respect to this total surface area. An encapsulation of 95% means, therefore, that 95% of the surface area surrounding the encapsulated space is closed and only 5% of this total surface area is formed by one of more openings.

The process according to the invention is therefore characterized by the at least very extensive separation of the protective gas atmosphere in a furnace space ("outer protective gas atmosphere"), which surrounds at least one capsule, from the protective gas atmosphere in the interior or reaction space of the capsule ("inner protective gas atmosphere"), in which (reaction space) the direct bonding takes place and in which the bonding components of metal and ceramic are held at least by means of the area at which the bonding is to take place.

Preferably the cross section of the at least one opening or the total cross section of a plurality of openings is such that this cross section or total cross section is less than 40% of the total inner surface area of the capsule enclosing the reaction space, i.e. so that the total encapsulation of the capsule is greater than 60%.

Surprisingly, the displacement of the air present in the interior of the capsule takes place in the invention by means of the protective gas atmosphere, whereby this also causes the oxygen content in the outer protective gas atmosphere to have no or essentially no effect on the quality of the metal-ceramic bond or of the metal-ceramic substrate produced, even if the outer protective gas atmosphere has an oxygen content that is far below or far above the equilibrium oxygen content. According to knowledge on which the invention is based, this essentially complete independence of the result achieved with the process according to the invention from the oxygen content of the outer protective gas atmosphere is due to the fact that at the relatively high processing temperature (960–1072° C.) at which direct bonding takes place, the diffusion of oxygen from the outer protective gas atmosphere surrounding the respective capsule into the inner protective as atmosphere in the interior of the capsule or in the reaction space is very low. This effect can be intensified by a controlled flow of the outer protective gas atmosphere, by directing the flow against the openings of the respective capsule at the beginning for the purpose of flushing. During actual bonding at the processing temperature the flow is then directed against the closed surface of the capsule.

In a preferred embodiment of the process according to the invention, however, the oxygen content in the protective gas atmosphere surrounding the capsule is regulated, or is at least limited by a regulator, whereby the precision required for regulation or setting does not have to be especially high. This compensates for rough deviations of the oxygen content, which (deviations) result either from the entry of oxygen at the furnace openings or from the consumption of oxygen as a result of oxidation of metal furnace components.

The process according to the invention takes advantage of the fact that the diffusion speed of gases decreases as the temperature rises. This means that at the beginning of the process the interior of the capsule, at the still low temperature, is flushed with the protective gas by the still high diffusion rate of the protective gas of the outer protective gas atmosphere, i.e. an inner protective gas atmosphere is achieved within the capsule that corresponds to the outer protective gas atmosphere. This equalization of the inner protective gas atmosphere with the outer protective has atmosphere can be intensified or accelerated by means of controlled flushing of the interior of the capsule.

With the increased heating of the capsule, of the bonding components located in the interior (reaction space) of the capsule and of the inner and outer gas atmosphere to the processing temperature the diffusion rate decreases, so that despite openings in the capsule the separation of the inner protective gas atmosphere from the outer protective gas atmosphere actually or virtually takes place. This causes an equilibrium oxygen content in the capsule or in the reaction space located there due to dissociation of the oxide layer of the metal foil or due to reaction of the oxygen in the protective gas with the metal foil in order to ensure optimum bonding of the bonding components, i.e. of the at least one metal foil with the at least one ceramic layer. The encapsulation for this is preferably 60–95%.

The regulation of the oxygen content in the outer protective gas atmosphere is preferably dependent on the encapsulation. Dependent on the encapsulation the oxygen content in the outer protective gas atmosphere is regulated as follows, for example:

Encapsulation of 60 to 80% with an oxygen content in the outer protective gas atmosphere between 2–20 ppm.

Encapsulation of 80–95% with an oxygen content in the outer protective gas atmosphere between 50 and 200 ppm or 1–20 ppm.

Encapsulation greater than 95% with an oxygen content in the outer protective gas atmosphere greater than 200 or smaller than 20 ppm.

The following table lists the results of tests performed using the process according to the invention to bond a plate-shaped ceramic (aluminum oxide ceramic) with a copper layer formed by a copper foil, with a varying oxygen content of the outer protective gas atmosphere and with a varying degree of encapsulation, at a processing temperature of 1068° C. in each test. The purpose of the tests was to examine the stability of the bond between the ceramic and the copper layer or copper foil (pull-off resistance in N/cm)

and also the surface quality (appearance) of the exposed copper surfaces.

| O₂ ppm | Encapsulation % | Pull-off resistance N/cm | Appearance of copper surface |
|---|---|---|---|
| <2 | 95 | >60 | bright |
| <2 | 80 | 50 | bright |
| <2 | 60 | 40 | bright |
| <2 | 50 | 30 | bright |
| 10 | 95 | >60 | bright |
| 10 | 60 | >60 | bright |
| 10 | 50 | >60 | slightly oxidized |
| 20 | 95 | >60 | bright |
| 20 | 80 | >60 | bright |
| 20 | 50 | >60 | slightly oxidized |
| 50 | 95 | >60 | bright |
| 50 | 80 | >60 | bright |
| 50 | 60 | >60 | bright |
| 50 | 50 | >60 | oxidized |
| 100 | 95 | >60 | bright |
| 100 | 80 | >60 | bright |
| 100 | 60 | >60 | slightly oxidized |
| 100 | 40 | >60 | heavily oxidized |
| 200 | 95 | >60 | bright |
| 200 | 80 | >60 | oxidized |

The above table therefore reflects the influence of the oxygen content in the outer atmosphere and the encapsulation on the pull-off resistance and the quality of the copper surfaces.

It was assumed above that the encapsulation of the reaction space is not 100%, but rather that the reaction space is connected with the outer protective gas atmosphere by means of an opening in order to enable the insertion of the bonding components in the encapsulated reaction space under normal atmosphere and to displace the normal atmosphere at the beginning of the actual process, especially to displace the air in the reaction space by the protective gas.

In order to create the required protective gas atmosphere in the reaction space of the capsule, the respective capsule is flushed with the protective gas of the outer protective gas atmosphere by means of the existing openings, i.e. the air present in the capsule is displaced by the protective gas. If the encapsulation is 100%, then it is necessary to otherwise flush the reaction space with protective gas before the direct bonding process, i.e. to replace the air present in the reaction space with the protective gas.

The at least one ceramic substrate and the at least one metal foil can be inserted in the respective capsule separately one after the other, or as a stack prepared outside of the capsule.

The metal foil for example is oxidized in a prior processing step before insertion into the capsule, for example by treating it with a suitable reactive gas, e.g. oxygen. In the process according to the invention, however, a pre-oxidized metal foil can also be used.

Oxygen as a reactive gas is suitable especially for metal foils made of copper.

The heating of the respective capsule and of the components located within this capsule to the direct bonding temperature takes place in a furnace, preferably in a continuous or tunnel furnace, whereby the furnace space contains the outer protective gas atmosphere with an adjusted or regulated oxygen content. The regulation of the oxygen content in the outer protective gas atmosphere takes place by dosing of oxygen to the protective gas.

However, the possibility of a 100% encapsulation of the reaction space is possible, whereby then a protective gas atmosphere with a certain oxygen content must be introduced into this reaction space.

It is also possible, however, to work with an oxygen-free protective gas, if a high oxide content on the metal foil corresponding to the free volume in the interior of the capsule is provided for. The required equilibrium oxygen content is then achieved through dissociation of the oxide.

Preferably the encapsulated space contains a buffer material, at least in the case of 100% encapsulation, with which (buffer material) the fractional oxygen content in the inner protective gas atmosphere, i.e. in the encapsulated reaction space at the reaction or bonding temperature is set and/or maintained at a value that ensures an optimum DCB bond between the metal (copper) and the ceramic, while at the same time preventing post-oxidation, which would be at least disturbing. This fractional oxygen content achieved by the buffer material is then preferably between 3–10 ppm. The buffer material contains for example CuO in powder form, possibly mixed with copper powder.

BRIEF DESCRIPTION OF THE DRAWINGS

The invention is described below in more detail based on the sample embodiments in the drawings.

FIG. 6 is a partial simplified representation in top plan view of a continuous furnace for conducting the process according to the invention.

DETAILED DESCRIPTION OF THE INVENTION

Figure 1:
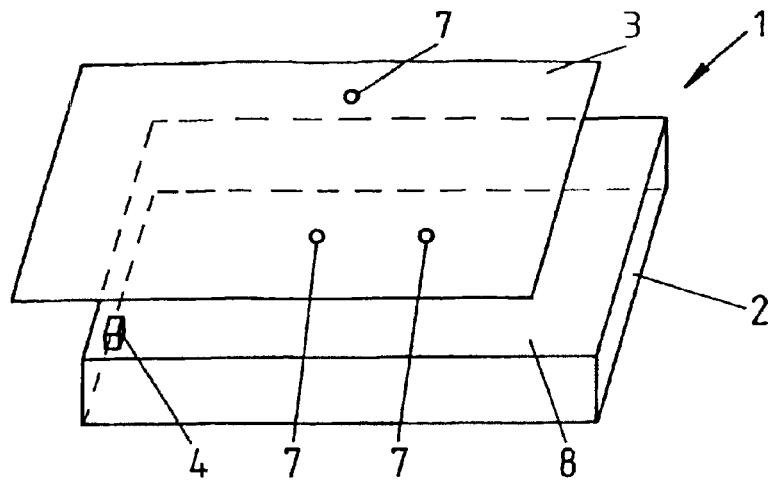
FIGS. 1–5 are simplified representations of various possible embodiments of the capsule.
Figure 2:
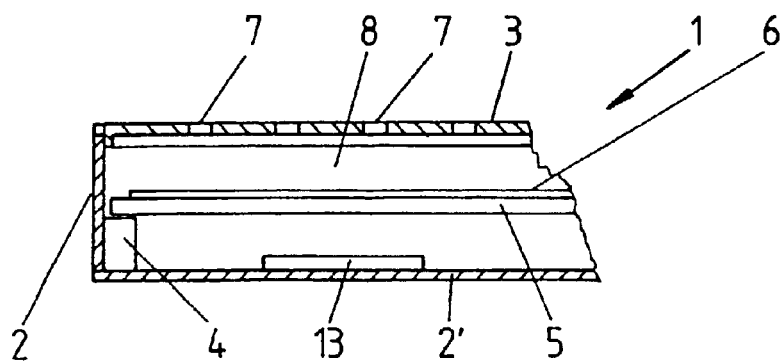

The capsule depicted in FIG. 1 and generally designated 1 is designed as a flat, rectangular or square dish or box, with a bottom part 2 that is open on the top side and with a lid 3, with which the bottom part 2 can be closed on its top side. In the bottom part 2 there are contact elements 4, onto which a ceramic plate 5 is placed as depicted in FIG. 2 in order to conduct the process, on the top side of which (ceramic plate) a copper layer 6 with oxidized surfaces and consisting of a copper foil lies, so that the layers consisting of the ceramic layer 5 and the copper layer 6, when the lid 3 is closed, are at a distance from both this lid and from the bottom side of the floor surface 2' of the bottom part. In the lid 3 there are openings 7, by means of which the encapsulated interior or reaction space 8 is connected with the surrounding atmosphere. The bonding of the copper layer 6 with the ceramic layer 5 takes place in a continuous furnace. The closed capsule 1 with the bonding components (ceramic layer 5/copper layer 6) located within this capsule is inserted into the furnace at an inlet. In a first furnace zone the air or the oxygen in the reaction space 8 is replaced by the protective gas atmosphere by means of openings 7; the protective gas atmosphere then has an oxygen content for example between 100 and 200 ppm with an encapsulation of 95%. In a further furnace zone the capsule 1 and the bonding components located within this capsule are heated to the processing temperature required for producing the DCB bond, for example 1068° C. In a further final furnace zone the capsule 1 and the bonding components located within this capsule are cooled and the bonding components are then bonded together to form the metal-ceramic substrate.

Figure 3:
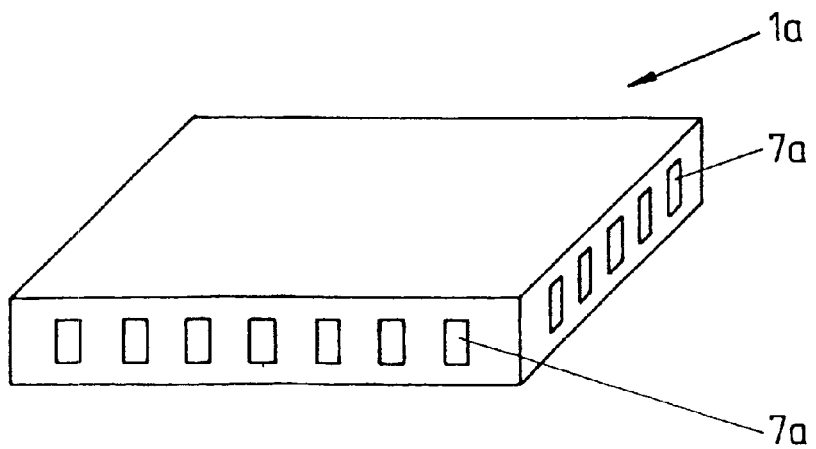

FIG. 3 shows as a further possible embodiment a capsule 1a, which differs from the capsule 1 essentially only by the fact that instead of the opening 7 in the lid 3 or in addition to these openings, additional openings 7a are provided on the peripheral surface of the capsule 1a. This enables in particular the stacking of a plurality of capsules 1a one above the other in the furnace.

Figure 4:
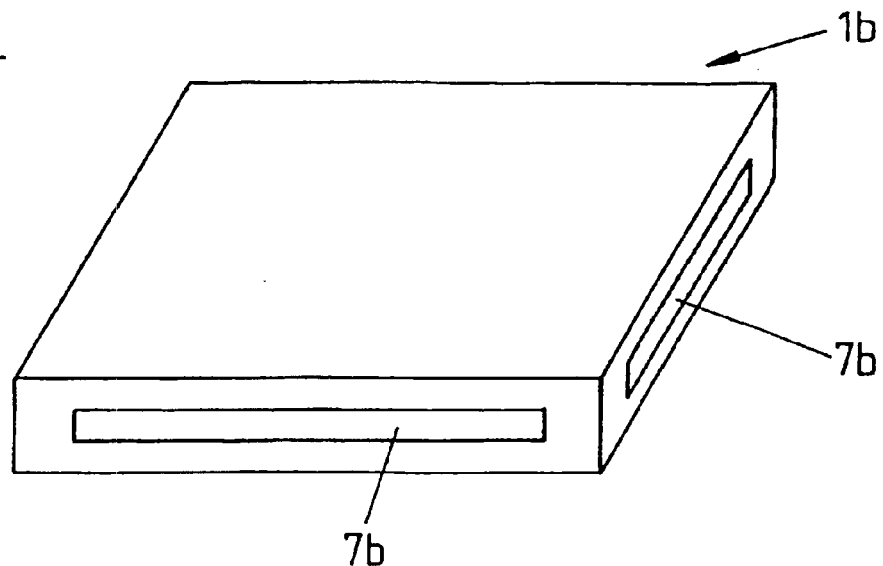

FIG. 4 shows as a further possible embodiment a capsule 1b, which differs from the capsule 1a essentially only by the fact that instead of a plurality of openings 7a only one opening 7b is provided on each peripheral side of the flat, rectangular or square bottom part 2b.

Figure 5:
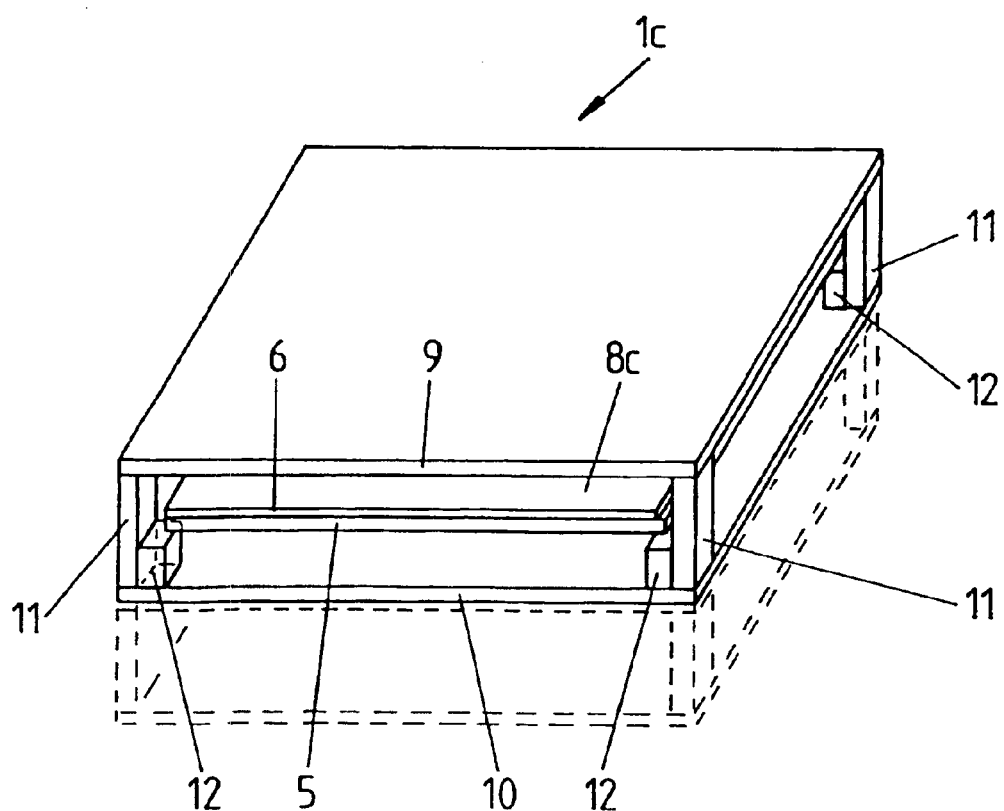

FIG. 5 shows as a further possible embodiment a capsule 1c, which consists essentially of an upper plate 9 and a lower plate 10, which are arranged parallel to each other and are connected with each other by means of spacers or posts 11. The latter are located in the corners of the rectangular or square plates 9 and 10. In the space 8c formed between the plates 9 and 10, which (space) corresponds to the space 8 of the capsule 1 in terms of its function and which in the depicted embodiment is open on the entire perimeter of the capsule 1c the bonding components can be inserted from the side individually one after the other or as a stack, such that the layers formed by the bonding components are supported with the ceramic layer 6 by support elements 12 that are provided on the lower plate 10.

Basically it is also possible to design the capsule 1c so that the space 8c is closed by a wall on at least one peripheral side, in an extreme embodiment on three peripheral sides, so that only one peripheral side is open, by means of which the insertion of the bonding components and the removal of the manufactured metal (copper)-ceramic substrate is possible.

The capsules 1, 1a, 1b, 1c are made of a high-temperature-resistant and oxidation-resistant material, for example of a suitable metal or also of several ceramic materials, such as $Al_2O_3$, $Si_3N_4$, SiC or forsterite or mullite. Other suitable materials are also conceivable for the capsules.

The capsules 1, 1a, 1b, 1c can be used for example in a plurality of rows next to each other and/or stacked in a continuous furnace, whereby for this latter application especially the capsules 1a, 1b and 1c that are open on the periphery are especially suitable, as indicated in FIG. 5 by the dotted lines.

The capsules 1–1c described above all have openings. Basically, as already mentioned, it is also possible to completely or almost completely close the reaction space formed in the capsule toward the outside, for example by using a lid 3 without the openings 7 of the capsule 1. In FIG. 2, 13 indicates a buffer material for regulating the oxygen content in the space 8, especially when this reaction space is completely or almost completely closed to the outside. If the reaction space is closed the process is also conducted in an outer protective gas atmosphere, since an absolutely tight seal would not be possible or would be possible only at an inordinate cost.

In FIG. 6, 14 generally designates a tunnel furnace with a transport belt 15, on which the capsules 1, 1a, 1b, 1c with the bonding components (ceramic layer 5 and copper layer 6) within these capsules are moved through the tunnel furnace 14 or through different zones of this furnace, for example through a pre-flushing zone 14.1, at which the interior or reaction space 8 of the capsules is flushed with a controlled protective gas stream. The flush zones 14.1 are located in the vicinity of the inlet 16 of the tunnel furnace 14, at which (inlet) the capsules with the bonding components are placed on the transporter 15.

The zone 14.1 is then followed by one or more temperature zones, in which heating to the processing temperature takes place, whereby also the zone 14.1 can already be part of such a temperature zone. Afterwards, the capsules are cooled in at least one further zone before they are then removed at the outlet not depicted of the tunnel furnace 14.

The invention was described above based on sample embodiments. Of course, numerous modifications and variations are possible without abandoning the underlying inventive idea upon which the invention is based.

| REFERENCE LIST | |
|---|---|
| 1, 1a, 1b, 1c | capsule |
| 2 | lower part |
| 2' | bottom of lower part |
| 3 | lid |
| 4 | contact element |
| 5 | ceramic plate |
| 6 | copper layer or copper foil |
| 7, 7a, 7b | opening |
| 8, 8c | reaction space or interior of capsule |
| 9 | upper plate of capsule 1c |
| 10 | lower plate of capsule 1c |
| 11 | post |
| 12 | support element |
| 13 | buffer material |
| 14 | tunnel furnace |
| 14.1 | flushing zone of tunnel furnace |
| 14.2 | temperature zone of tunnel furnace |
| 14, 15 | transport belt |
| 16 | inlet |

What is claimed is:

1. A process for the manufacture of metal-ceramic compound material, comprising bonding at least one plate-shaped ceramic substrate with an oxidized metal foil, by heating under protective gas to a processing temperature that is below the melting point of the metal of the metal foil but at least equal to the melting temperature of a eutectic formed by the oxide layer, wherein the at least one ceramic substrate and the at least one metal foil to be bonded with this substrate are located during this process in a reaction space formed by a capsule with an inner protective gas atmosphere that is separated by the capsule from an outer protective gas atmosphere surrounding this capsule.

2. The process for the manufacture of metal-ceramic compound material as claimed in claim 1, wherein the reaction space is tightly closed against the outer protective gas atmosphere surrounding the capsule.

3. The process for the manufacture of metal-ceramic compound material as claimed in claim 1, wherein the reaction space is connected with the outer protective gas atmosphere surrounding the capsule by means of a least one opening, and that the opening is such that the encapsulation of the reaction space that is defined as a percentage of a closed part of the overall surface area enclosing the reaction space in relation to this overall surface area, is greater than 60%.

4. The process for the manufacture of metal-ceramic compound material as claimed in claim 1, wherein the capsule has at least one opening.

5. The process for the manufacture of metal-ceramic compound material as claimed in claim 1, wherein the maximum permitted oxygen content for the process in the outer protective gas atmosphere increases with an increasing degree of encapsulation.

6. The process for the manufacture of metal-ceramic compound material as claimed in claim 1, wherein the outer protective gas atmosphere has an oxygen content of approximately 50 to 100 ppm at an encapsulation of 60 to 80%.

7. The process for the manufacture of metal-ceramic compound material as claimed in claim 1, wherein the outer protective gas atmosphere has an oxygen content of approximately 2 to 20 ppm at an encapsulation of 60 to 80%.

8. The process for the manufacture of metal-ceramic compound material as claimed in claim 1, wherein the outer protective gas atmosphere has an oxygen content of 50 to 200 ppm at an encapsulation of 80–95%.

9. The process for the manufacture of metal-ceramic compound material as claimed in claim 1, wherein the outer protective gas atmosphere has an oxygen content of 1 to 20 ppm at an encapsulation of 80–95%.

10. The process for the manufacture of metal-ceramic compound material as claimed in claim 1, wherein the outer protective gas atmosphere has an oxygen content of less than 20 ppm or greater than 200 ppm at an encapsulation of greater than 95%.

11. The process for the manufacture of metal-ceramic compound material as claimed in claim 1, wherein the capsule is made of a high temperature-resistant and oxidation-resistant metal.

12. The process for the manufacture of metal-ceramic compound material as claimed in claim 1, wherein the capsule that is made of at least one ceramic material, said ceramic material is $Al_2O_3$, $Si_3N_4$, SiC, forsterite or mullite or combinations thereof.

13. The process for the manufacture of metal-ceramic compound material as claimed in claim 1, further comprising the use of a capsule in the form of a frame enclosing the reaction space.

14. The process for the manufacture of metal-ceramic compound material as claimed in claim 1, wherein the capsule consists of an upper wall and a lower wall and spacers holding these walls at a mutual distance.

15. The process for the manufacture of metal-ceramic compound material as claimed in claim 1, wherein the capsule that is open on at least one peripheral side for insertion and removal of the components.

16. The process for the manufacture of metal-ceramic compound material as claimed in claim 1, further comprising a dish shaped capsule with a lid.

17. The process for the manufacture of metal-ceramic compound material as claimed in claim 1, wherein the capsule with at least one opening on one peripheral side or on one bottom or on one lid.

18. The process for the manufacture of metal-ceramic compound material as claimed in claim 1, wherein the capsule with at least one contact surface for the bonding components.

19. The process for the manufacture of metal-ceramic compound material as claimed in claim 1, wherein the capsule with a buffer material located in the reaction space for creation of an oxygen equilibrium potential in the reaction space during the direct bonding process.

20. The process for the manufacture of metal-ceramic compound material as claimed in claim 19, further comprising the use of a buffer material with a copper oxide base.

21. The process for the manufacture of metal-ceramic compound material as claimed in claim 3, wherein the encapsulation is in the range between 99 and 65%.

22. The process for the manufacture of metal-ceramic compound material as claimed in claim 1, further comprising a tunnel furnace or continuous furnace, in which the capsules are located on a transporter.

23. The process for the manufacture of metal-ceramic compound material as claimed in claim 1, wherein a plurality of capsules are stacked and/or located in plurality of rows next to each other on a transporter of the continuous or tunnel furnace.

24. The process for the manufacture of metal-ceramic compound material as claimed in claim 22, wherein in the continuous furnace and before the direct bonding or heating to the processing or bonding temperature, preheating of the at least one capsule and after bonding cooling of the capsules takes place, both in the outer protective gas atmosphere.

25. The process for the manufacture of metal-ceramic compound material as claimed in claim 1, wherein before the heating of the respective capsule with the bonding components to the processing or bonding temperature, at least one flushing of the reaction space with a flushing gas stream takes place through the openings of the capsule, whereby the gas of the flushing gas stream is the gas of the outer protective gas atmosphere.

* * * * *